(12) United States Patent
Leng

(10) Patent No.: US 10,643,887 B2
(45) Date of Patent: May 5, 2020

(54) METHOD OF MANUFACTURING DAMASCENE THIN-FILM RESISTOR (TFR) IN POLY-METAL DIELECTRIC

(71) Applicant: Microchip Technology Incorporated, Chandler, AZ (US)

(72) Inventor: Yaojian Leng, Portland, OR (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/037,941

(22) Filed: Jul. 17, 2018

(65) Prior Publication Data
US 2019/0109186 A1 Apr. 11, 2019

Related U.S. Application Data

(60) Provisional application No. 62/569,261, filed on Oct. 6, 2017.

(51) Int. Cl.
*H01L 21/768* (2006.01)
*H01L 23/522* (2006.01)
(Continued)

(52) U.S. Cl.
CPC .. *H01L 21/76805* (2013.01); *H01L 21/76802* (2013.01); *H01L 21/76804* (2013.01);
(Continued)

(58) Field of Classification Search
CPC ......... H01L 21/76802; H01L 21/76805; H01L 21/76807
See application file for complete search history.

(56) References Cited

U.S. PATENT DOCUMENTS 9,679,844 B2 6/2017 Leng et al.
9,991,330 B1 * 6/2018 Edelstein ................ H01L 28/24
(Continued)

FOREIGN PATENT DOCUMENTS

WO 2016/205604 A1 12/1916 .......... H01L 21/768

OTHER PUBLICATIONS

Kwon, Young-Cheon et al., "Process Optimization of Integrated SiCr Thin-Film Resistor for High-Performance Analog Circuits," IEEE Transactions on Electron Devices, vol. 61, No. 1, pp. 8-14, Jan. 1, 2014.
(Continued)

*Primary Examiner* — Michael Jung
(74) *Attorney, Agent, or Firm* — Slayden Grubert Beard PLLC

(57) ABSTRACT

A damascene thin-film resistor (TFR), e.g., a damascene thin-film resistor module formed within a poly-metal dielectric (PMD) layer using a single added mask layer, and a method for manufacturing such a device, are disclosed. A method for manufacturing a TFR structure may include forming a pair of spaced-apart TFR heads formed as self-aligned silicide poly (salicide) structures, depositing a dielectric layer over the salicide TFR heads, patterning and etching a trench extending laterally over at least a portion of each salicide TFR head and exposing a surface of each salicide TFR heads is exposed, and depositing a TFR material into the trench and onto the exposed TFR head surfaces, to thereby form a TFR layer that bridges the pair of spaced-apart TFR heads.

20 Claims, 7 Drawing Sheets

(51) Int. Cl.
*H01L 23/532* (2006.01)
*H01L 49/02* (2006.01)
(52) U.S. Cl.
CPC .... *H01L 21/76807* (2013.01); *H01L 23/5228* (2013.01); *H01L 23/53214* (2013.01); *H01L 23/53228* (2013.01); *H01L 28/24* (2013.01)

(56) References Cited

U.S. PATENT DOCUMENTS

| | | | | |
|---|---|---|---|---|
| 2004/0262709 | A1* | 12/2004 | Yamashita | H01C 7/006 257/516 |
| 2005/0218478 | A1 | 10/2005 | Watanabe | 257/536 |
| 2006/0027892 | A1* | 2/2006 | Yamashita | H01L 23/5228 257/536 |
| 2010/0155893 | A1* | 6/2010 | Chen | H01C 7/006 257/537 |
| 2012/0313220 | A1* | 12/2012 | Yang | H01L 23/5228 257/537 |
| 2017/0301747 | A1* | 10/2017 | Edelstein | H01L 28/24 |

OTHER PUBLICATIONS

International Search Report and Written Opinion, Application No. PCT/US2018/053684, 15 pages, dated Jan. 22, 2019.

* cited by examiner

US 10,643,887 B2

METHOD OF MANUFACTURING DAMASCENE THIN-FILM RESISTOR (TFR) IN POLY-METAL DIELECTRIC

RELATED PATENT APPLICATION

This application claims priority to commonly owned U.S. Provisional Patent Application No. 62/569,261 filed Oct. 6, 2017, the entire contents of which are hereby incorporated by reference for all purposes.

TECHNICAL FIELD

The present disclosure relates to a damascene thin-film resistor (TFR), in particular a damascene TFR module formed within a poly-metal dielectric (PMD) layer using a single added mask layer and a method for manufacturing such a device.

BACKGROUND

Semiconductor integrated circuits (IC) typically include metallization layers used to connect various components of the IC, called interconnect, or back end of line (BEOL) elements. Copper often preferred over aluminum due to its lower resistivity and high electro-migration resistance. Copper interconnect, however, is typically difficult to manufacture with traditional photoresist masking and plasma etching used for aluminum interconnect.

One known technique for forming copper interconnects on an IC is known as additive patterning, sometimes called a damascene process, which refers to traditional metal inlaying techniques. A so-called damascene process may include patterning dielectric materials, such as silicon dioxide, or fluorosilicate glass (FSG), or organo-silicate glass (OSG) with open trenches where the copper or other metal conductors should be. A copper diffusion barrier layer (typically Ta, TaN, or a bi-layer of both) is deposited, followed by a deposited copper seed layer, followed by a bulk Copper fill, e.g., using an electro-chemical plating process. A chemical-mechanical planarization (CMP) process may then be used to remove any excessive copper and barrier, and may thus be referred to as a copper CMP process. The copper remaining in the trench functions as a conductor. A dielectric barrier layer, e.g., SiN or SiC, is then typically deposited over the wafer to prevent copper corrosion and improve device reliability.

With more features being packed into individual semiconductor chips, there is an increased need to pack passive components, such as resistors, into the circuits. Some resistors can be created through ion implantation and diffusion, such as poly resistors. However, such resistors typically have high variations in resistance value, and may also have resistance values that change drastically as a function of temperature. A new way to construct integrated resistors, called Thin-Film Resistors (TFRs) has been introduced in the industry to improve integrated resistor performance. Known TFRs are typically formed from SiCr (silicon-chromium), SiCCr (silicon-silicon carbide-chromium), TaN (tantalum nitride), NiCr (nickel-chromium), AlNiCr (aluminum-doped nickel-chromium), or TiNiCr (titanium-nickel-chromium), for example.

FIG. 1 shows a cross-sectional view of two example TFRs 10A and 10B devices implemented using conventional processes. Fabrication of conventional TFRs 10A and 10B devices typically requires three added mask layers. A first added mask layer is used to create the TFR heads 12A and 12B. A second added mask layer is used to create the TFRs 14A and 14B. A third added mask layer is used to create TFR vias 16A and 16B. As shown, TFRs 12A and 12B are formed across the top and bottom of TFR heads 12A and 12B, respectively, but in each case three added mask layers are typically required.

FIG. 2 shows a cross-sectional view of a known IC structure including an example TFR 30 formed in view of the teachings of U.S. Pat. No. 9,679,844, wherein TFR 30 can be created using a single added mask layer and damascene process. A TFR film 34, in this example a SiCCr film, may be deposited into trenches patterned into a previously processed semiconductor substrate. As shown, SiCCr film 34 is constructed as a resistor between conductive (e.g., copper) TFR heads 32, with an overlying dielectric region including a dielectric layer 36 (e.g., SiN or SiC) and a dielectric cap region 38 (e.g., $SiO_2$) formed over the SiCCr film 34. The IC structure including TFR 30 may be further processed for a typical Cu (copper) interconnect process (BEOL), e.g., next level of via and trench. TFR 30 may be connected with other part of the circuit using typical copper via connected to the copper TFR heads 32.

Embodiments of TFR 30 may be particularly suitable for copper BEOL, which may have limitations regarding annealing (e.g., anneal temperature may be limited to about 200° C.). However, there is a need to construct damascene TFR for both Cu interconnects and Al interconnects. Furthermore, there is a need to construct TFR before metallization (either Cu or Al), so the TFR can be annealed at high temperature (e.g., around 500° C.) to achieve 0 ppm or near 0 ppm temperature coefficient of resistance (TCR).

SUMMARY

Embodiments of the present disclosure provide a damascene thin-film resistor (TFR), e.g., a damascene TFR module formed within a poly-metal dielectric (PMD) layer using a single added mask layer and a method for manufacturing such a device. Embodiments of the disclosed TFR may be suitable for various interconnect materials, including Cu and Al BEOL, for example. Further, embodiments of the disclosed TFR may utilize various TFR materials, including SiCCr, SiCr, TaN, NiCr, AlNiCr, or TiNiCr for example.

In some embodiments, TFR heads formed from poly (e.g., silicided, $CoSi_2$ or $TiSi_2$) may be used instead of copper TFR used in conventional TFR modules. The, the TFR module may be formed in PMD (poly-metal dielectric, between poly and metal 1), which can be annealed at high temperature (e.g., about 500° C.) without harm to the interconnect metals (Cu or Al).

BRIEF DESCRIPTION OF THE DRAWINGS

Example aspects of the present disclosure are described below in conjunction with the figures, in which.

DETAILED DESCRIPTION

Embodiments of the present disclosure provide a damascene TFR formed within a poly-metal dielectric (PMD) layer using a single added mask layer, and a method for manufacturing such TFR device.

Figure 1:
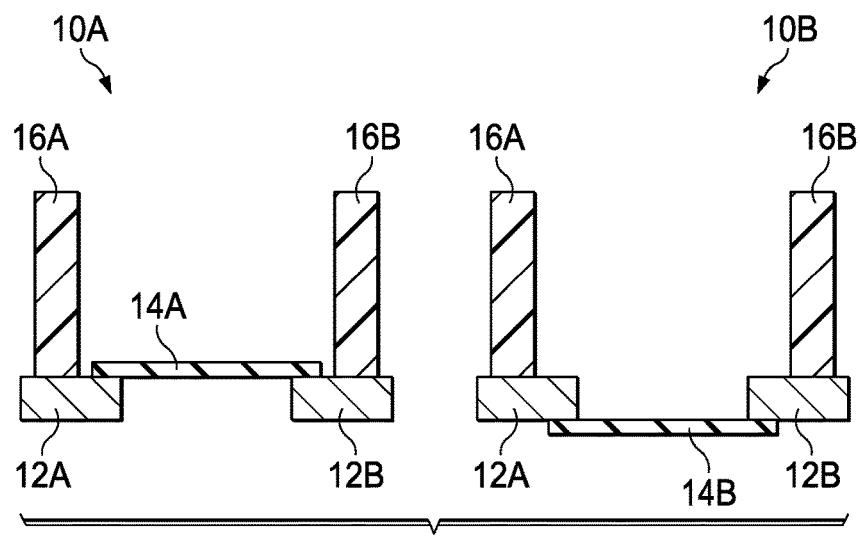
FIG. 1 is a cross-sectional view of two example thin-film resistor (TFR) devices implemented using known processes.
Figure 2:
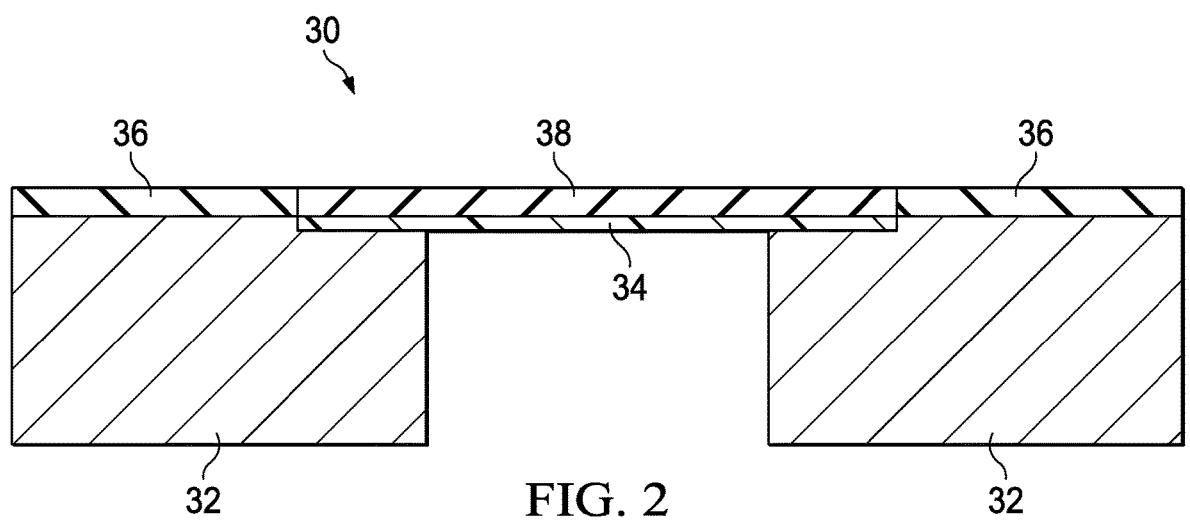
FIG. 2 is a cross-sectional view of a known integrated circuit (IC) structure including an example TFR formed according to known techniques.
Figure 3:
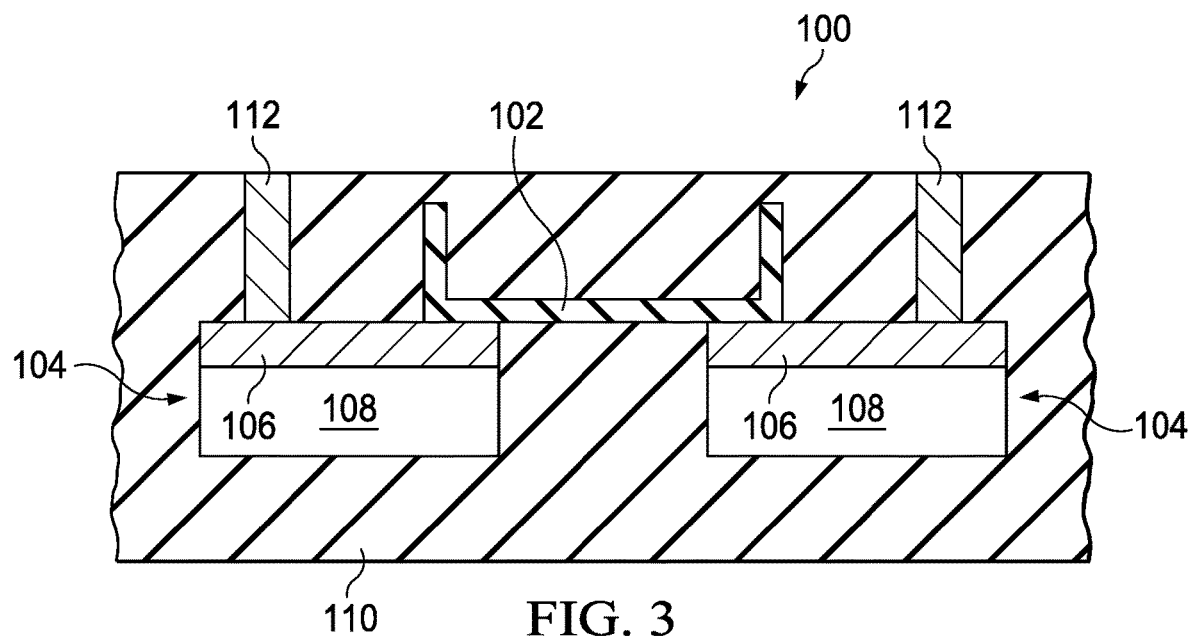
FIG. 3 shows an example IC structure including a thin-film resistor (TFR) formed according to one embodiment of the present invention.

FIG. 3 shows an example IC structure 100 including a thin-film resistor (TFR) 102 formed according to one embodiment of the present disclosure. TFR 102 may be formed within a poly-metal dielectric (PMD) layer using a single added mask layer, e.g., according to the example damascene approach discussed below with reference to FIG. 4A-4K. As shown, TFR 102 extends between a pair of TFR heads 104 formed over field oxide 110. Each TFR head 104 may comprise a poly region 106 having a silicide contact layer 106 formed over a poly region 108, e.g., using a salicide (self-aligned silicide) process, as discussed below. Conductive TFR vias 112 may be connected to each silicide contact 106. In the illustrated example, TFR 102 may be formed from SiCr, which may be annealed during the fabrication process to achieve 0 ppm or near 0 ppm TCR.

Figure 4A:
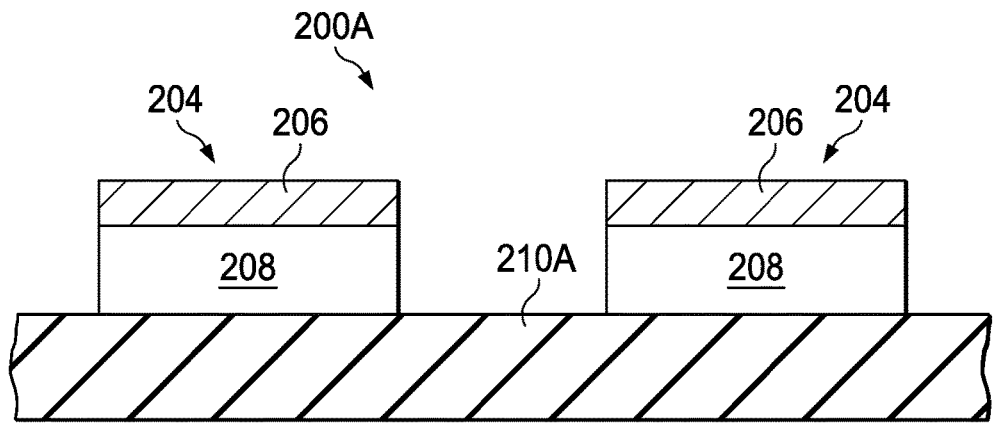
FIG. 4A-4K illustrate an example process for forming the example IC structure with integrated TFR shown in FIG. 3, according to one example embodiment.

FIG. 4A-4K illustrate an example process for forming the example IC structure with thin-film resistor (TFR) shown in FIG. 3, according to one example embodiment. FIG. 4A shows the initial formation of an IC structure 200, by forming a pair of TFR heads 204 over field oxide 210A. TFR heads 204 may be formed as salicide (self-aligned silicide poly) structures including a silicide layer 206 over a poly structure 208. The salicide structures 204 may comprise any suitable silicon-based chemistry, e.g., $CoSi_2$, $Co_2Si$, CoSi, NiSi, or $TiSi_2$, for example.

Figure 4B:
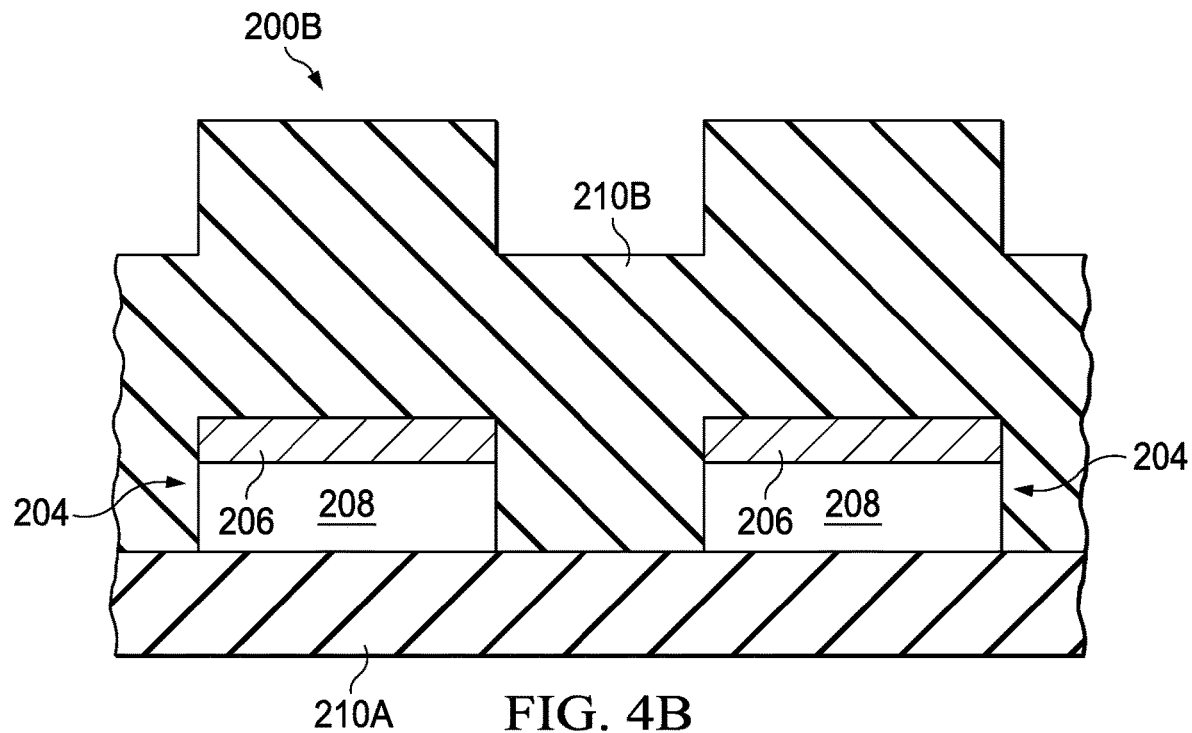

As shown in FIG. 4B, structure 200 may be further processed by depositing additional silicon-based dielectric 210B over the structure, e.g., using a known HDP deposition process. In an example embodiment, the structure may include a 1K SRO (Silicon Rich Oxide) deposition, followed by 10K HDP (High-Density Plasma) deposition in region 210B.

Figure 4C:
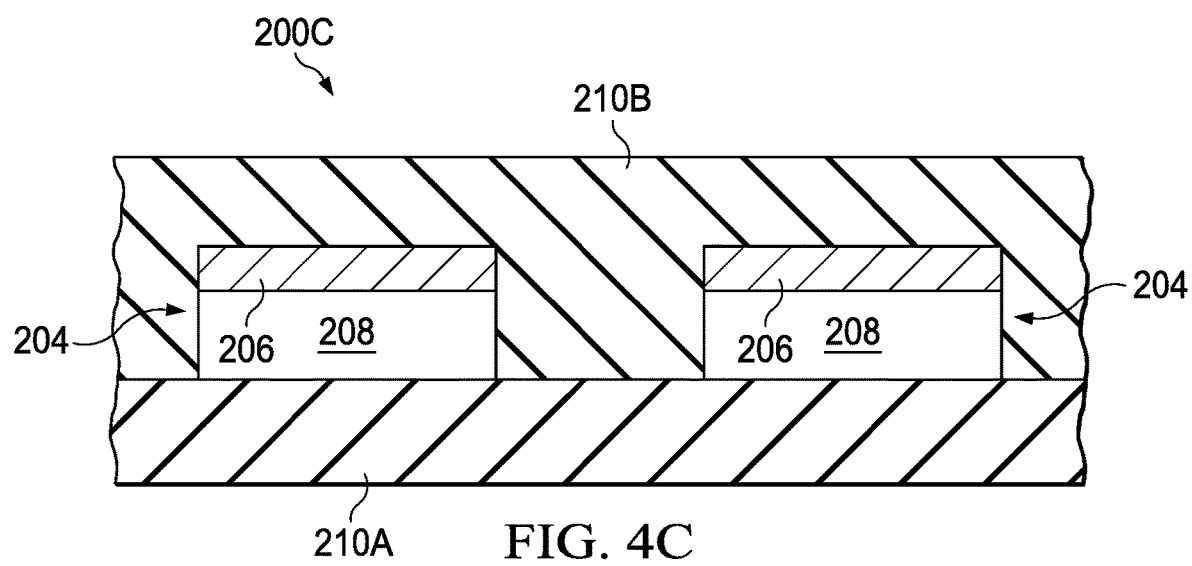

As shown in FIG. 4C, structure 200 may be further processed by performing a pre-metal dielectric chemical/mechanical planarization (PMD CMP) on the structure. In one example embodiment, the PMD CMP uses a target thickness of 6K over active (e.g., about 4K over each poly structure 208).

Figure 4D:
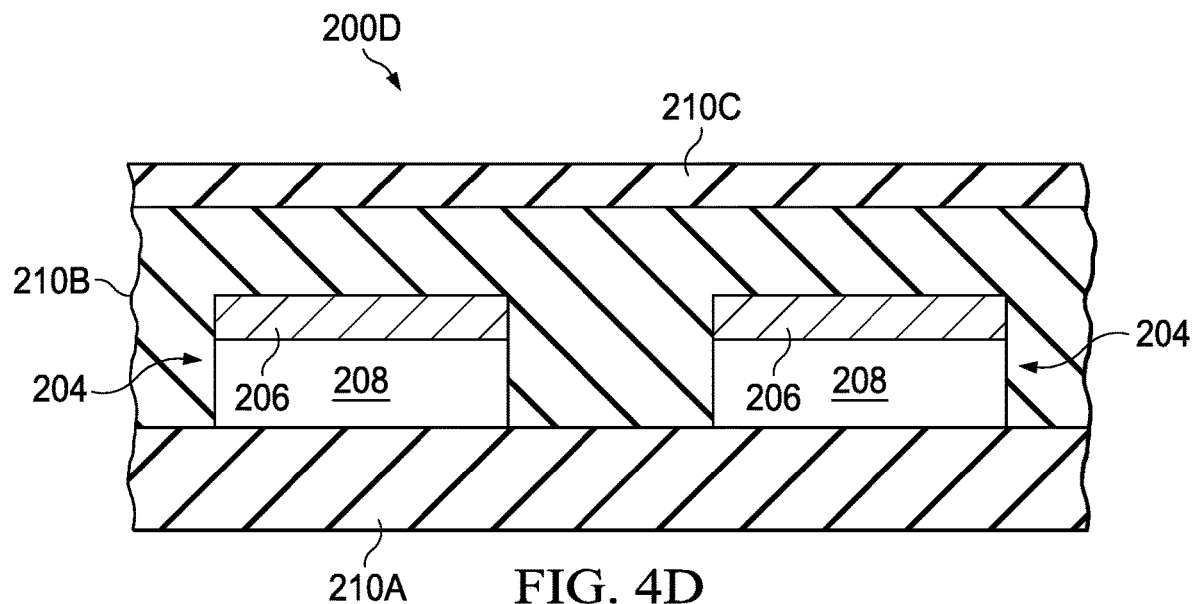

As shown in FIG. 4D, structure 200 may be further processed by adding a layer of sacrificial oxide 210C (e.g., about 1K thickness), which may be subsequently polished away, as discussed below with respect to FIG. 4I.

Figure 4E:
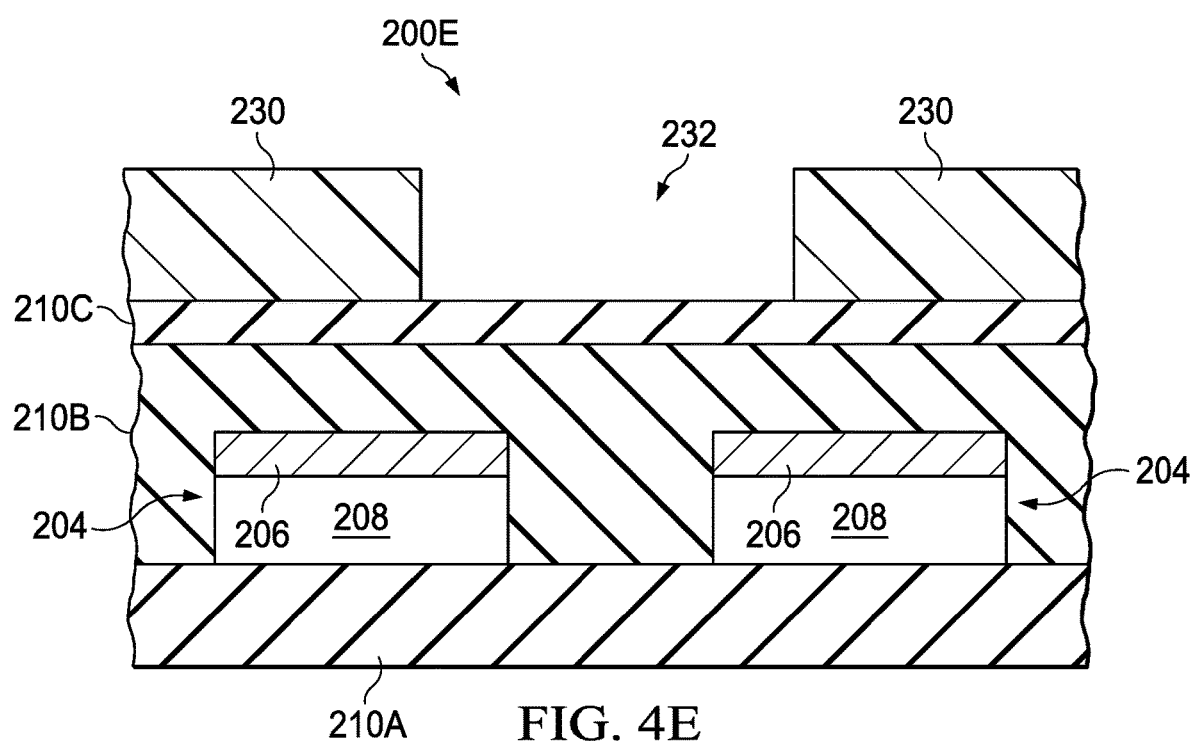

As shown in FIG. 4E, structure 200 may be further processed by depositing and patterning a photo resist layer 230 for forming a TFR trench.

Figure 4F:
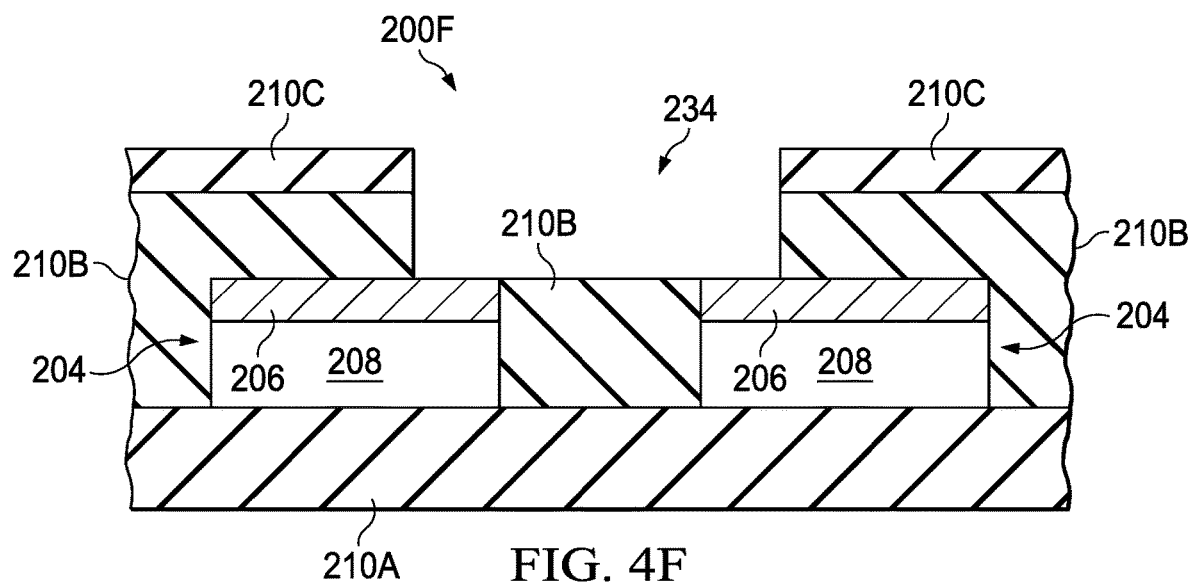

As shown in FIG. 4F, structure 200 may be further processed by etching a TFR trench 232 using any suitable etch process, which may be selective to stop on the silicide layers 206, and the remaining photo resist material 230 may then be removed, e.g., stripped off.

Figure 4G:
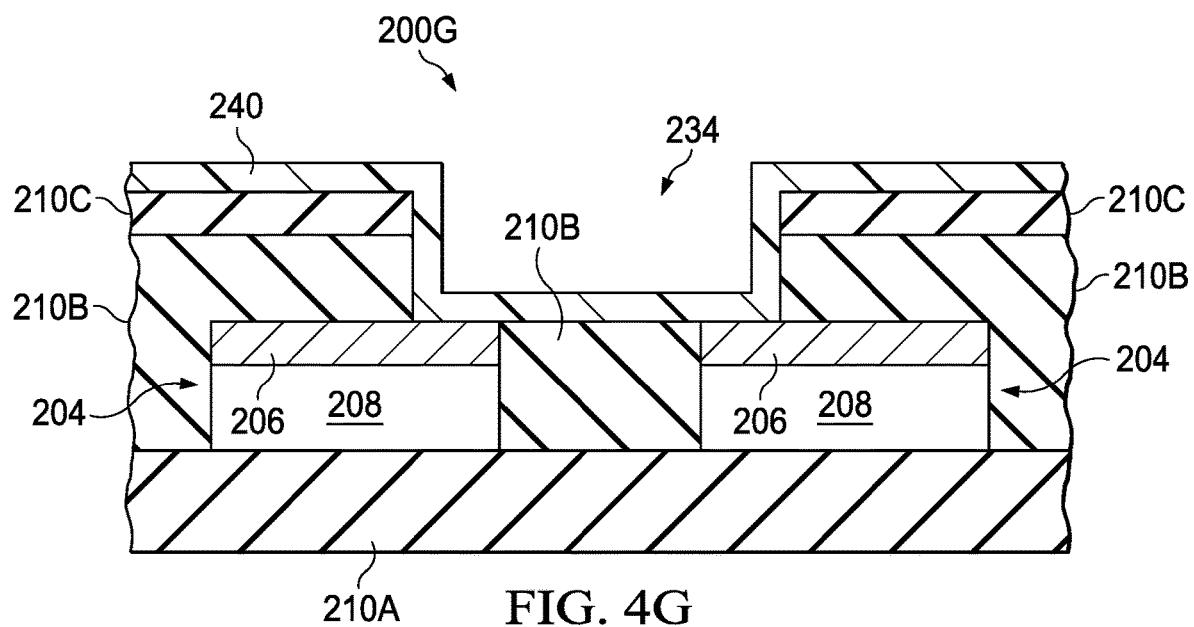

As shown in FIG. 4G, structure 200 may be further processed by depositing a layer of TFR material 240 over the structure and extending into the TFR trench 234, e.g., using a PVD or sputter deposition process. In one embodiment, TFR layer 240 may comprise a SiCr layer with a thickness of about 500 Å (e.g., 400 Å-600 Å). In other embodiments, TFR layer 240 may comprise SiCCr, TaN, NiCr, AlNiCr, TiNiCr, or any other suitable TFR material.

Structure 200 including TFR layer 240 may then be annealed, e.g., at a temperature of about 500° C. (e.g., 400° C.-600° C. or 450° C.-550° C.) to achieve 0 ppm or near 0 ppm TCR (temperature coefficient of resistance) of the TFR layer 240. In some embodiments, "near 0" ppm TCR may include a TCR of 0±100 ppm/° C., or a TCR of 0±50 ppm/° C., or a TCR of 0±20 ppm/° C., or a TCR of 0±10 ppm/° C., depending on the particular embodiment.

Figure 4H:
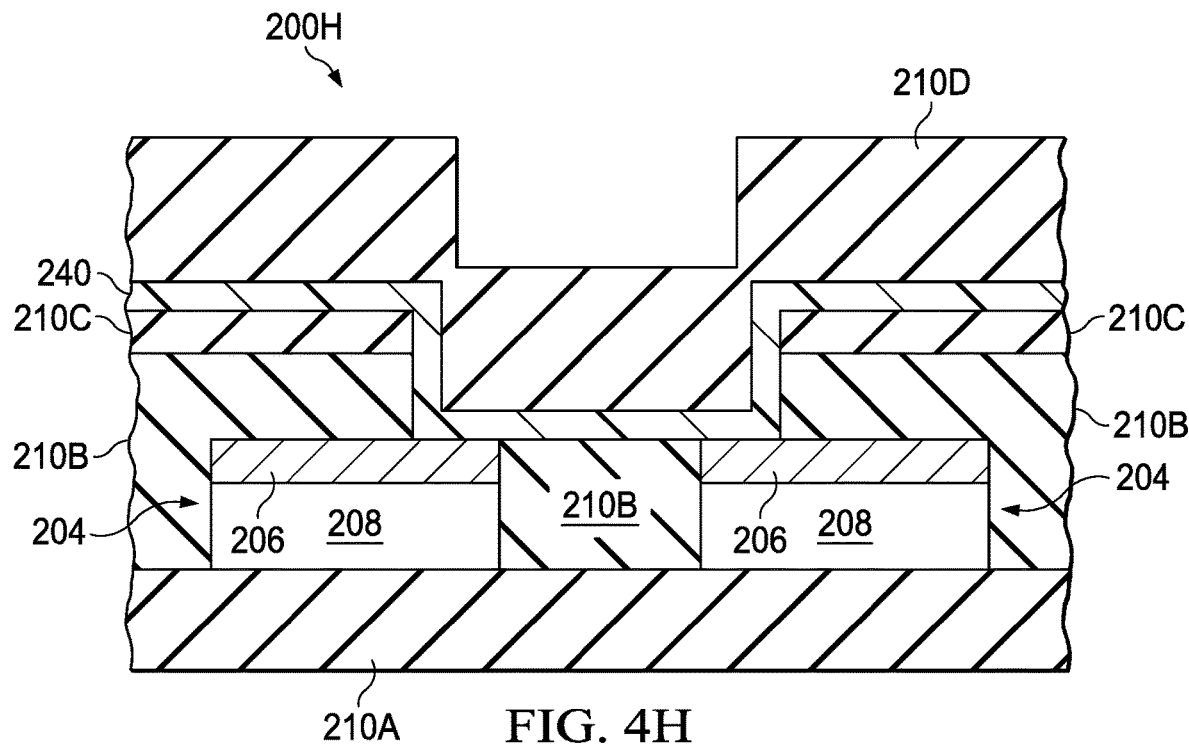

As shown in FIG. 4H, structure 200 may be further processed by depositing a cap oxide 210D on structure 200, to protect TFR film 240. The deposited cap oxide 210D may partially or completely fill the TFR trench 234. In one embodiment, the deposited cap oxide layer 210D has a thickness of about 4K.

Figure 4I:
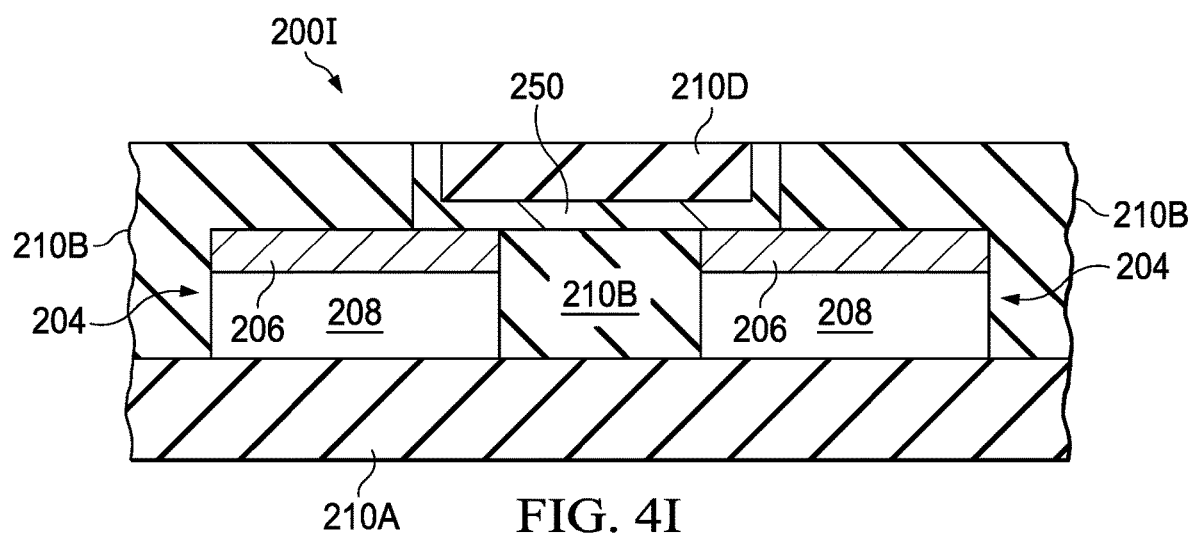

As shown in FIG. 4I, structure 200 may be further processed by performing a polishing process to polish off the cap oxide 210D, portions of the TFR layer 240 layer outside the TFR trench 234, and the sacrificial oxide layer 210C, to thereby define a final TFR film structure 250. In one embodiment, the process may use the same target HDP thickness, as shown in FIG. 4C, so that regions of the wafer outside the location of the TFR module insertion are the same as prior to the start of the TFR module formation (FIG. 4C). In other words, the TFR module and fabrication process steps can be modularized, and can be added or omitted without altering other part of the wafer or process.

Figure 4J:
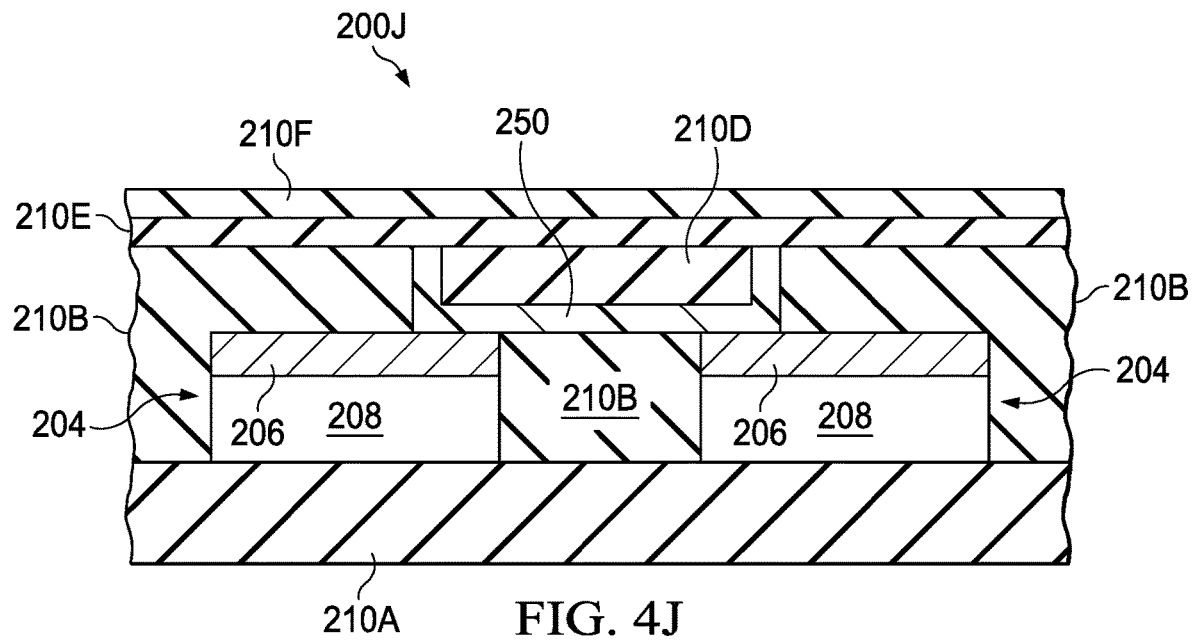

As shown in FIG. 4J, structure 200 may be further processed by depositing a phosphosilicate glass (PSG) layer or film 210E and an un-doped silicate glass (USG) cap oxide layer 210F may be deposited on the structure. In one example embodiment, PSG 210E and USG 210F may each have a deposited thickness of about 2K.

Figure 4K:
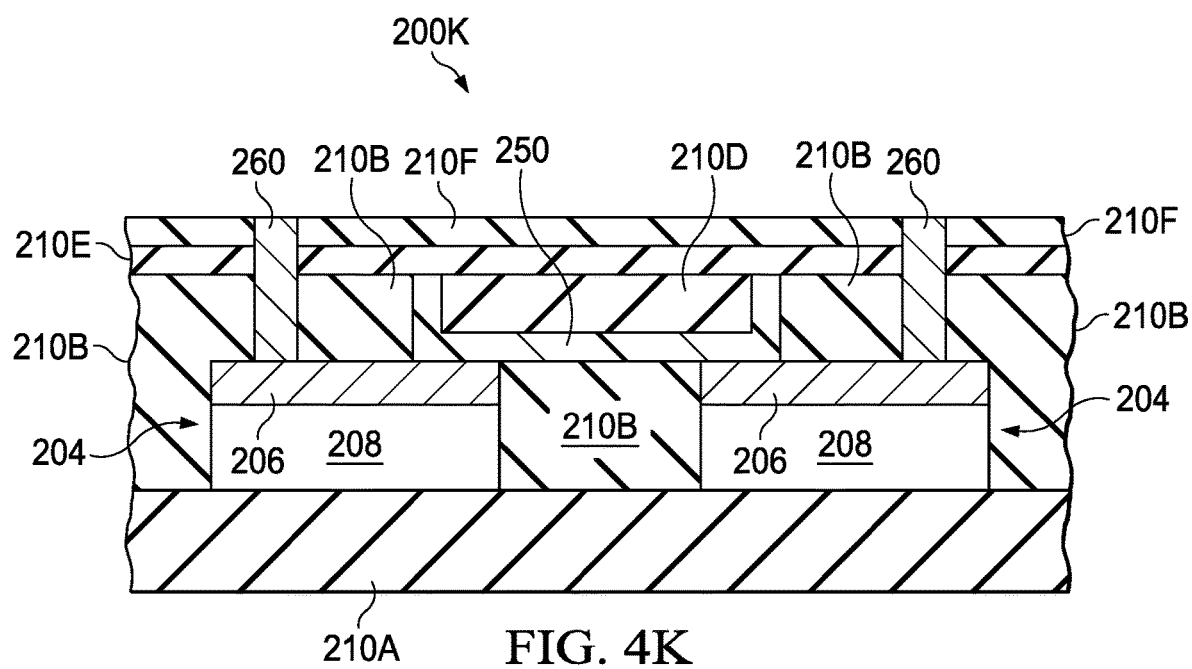

As shown in FIG. 4K, a pair of via-type contacts 260 connected to TFR heads 204 may be formed by patterning and etching the structure to define a pair of via openings, filling the via openings with a conductive material, e.g., tungsten (W), and performing a CMP process.

In this manner, a TFR film may be formed incorporated in PMD and connected between a pair of salicide TFR heads, using a damascene approach with a single mask layer. Further, in some embodiments, the TFR film may formed from SiCr, which may be annealed to achieve 0 ppm or near 0 ppm TCR, and the TFR may be used with both Cu interconnects and Al interconnects.

Thus, in contrast to certain conventional techniques, in the disclosed embodiments, the TFR contact is created as part of a typical CMOS contact creation process, thereby eliminating one mask. Further, the TFR heads are salicide (poly) structures created in a typical CMOS process flow, which eliminates another mask. As a result, the TFR may be formed using only a single mask. Further, the TFR may be formed through damascene (CMP), as opposed to wet or dry etch processes used in certain conventional techniques.

The invention claimed is:

1. A method for manufacturing a thin film resistor (TFR) structure, the method comprising:
   forming a pair of TFR heads spaced apart from each other, each TFR head comprising a self-aligned silicide (salicide) structure;
   depositing a dielectric layer over the salicide TFR heads;
   patterning a photoresist trench into a photoresist layer using photo lithography, the patterned photoresist trench extending laterally over at least a portion of each salicide TFR head;
   etching through the photoresist trench and through at least a portion of the dielectric layer and stopping at the salicide TFR heads to define a single TFR trench, such that a surface of each salicide TFR head is exposed in the single TFR trench; and depositing a TFR material into the single TFR trench and onto the exposed surfaces of the salicide TFR heads, to thereby form a TFR layer that bridges the pair of spaced-apart salicide TFR heads.

2. The method of claim 1, wherein the TFR material comprises SiCr.

3. The method of claim 1, comprising annealing the TFR structure after depositing the TFR material to alter a temperature coefficient of resistance (TCR) of the TFR material.

4. The method of claim 3, comprising annealing the structure to achieve a TCR of the TFR material to a non-zero TCR value of less than |1100 ppm/° C.|.

5. The method of claim 3, comprising annealing the structure to achieve a TCR of the TFR material to a non-zero TCR value of less than |50 ppm/° C.|.

6. The method of claim 3, comprising annealing the structure to achieve a TCR of the TFR material to a non-zero TCR value of less than |10 ppm/° C.|.

7. The method of claim 3, comprising annealing the structure at a temperature in the range of 450° C. to 550° C.

8. The method of claim 1, further comprising performing a Chemical Mechanical Polishing (CMP) process to remove portions of the TFR material outside the single TFR trench.

9. The method of claim 8, further comprising, after the removal process to remove portions of the TFR material outside the single TFR trench, forming at least one of a phosphosilicate glass (PSG) layer or an un-doped silicate glass (USG) cap oxide layer over the structure.

10. The method of claim 1, further comprising forming conductive contacts to contact each salicide TFR head.

11. The method of claim 1, further comprising conductively connecting the TFR structure to at least one aluminum interconnect.

12. The method of claim 1, further comprising conductively connecting the TFR structure to at least one copper interconnect.

13. The method of claim 1, further wherein the TFR layer comprises a continuous TFR region lying in a single horizontal plane and contacting both of the spaced-apart salicide TFR heads.

14. The method of claim 1, further comprising:
after depositing the dielectric layer over the salicide TFR heads, forming a sacrificial layer over the dielectric layer;
wherein the etching step removes a portion of the sacrificial layer below the photoresist trench; and
after depositing the TFR material to thereby form the TFR layer that bridges the pair of spaced-apart salicide TFR heads, removing (a) portions of the TFR material laterally outside the single TFR trench along with (b) remaining portions of the sacrificial layer.

15. A method for manufacturing a thin film resistor (TFR) structure, the method comprising:
forming a pair of TFR heads spaced apart from each other, each TFR head comprising a self-aligned silicide (salicide) structure;
depositing a dielectric layer over the salicide TFR heads;
patterning a photoresist trench into a photoresist layer using photo lithography, the patterned photoresist trench extending laterally over at least a portion of each salicide TFR head;
etching through the photoresist trench and through at least a portion of the dielectric layer and stopping at the salicide TFR heads, such that a surface of each salicide TFR head is exposed; and
depositing a TFR material into the TFR trench and onto the exposed surfaces of the salicide TFR heads, to thereby form a TFR layer that bridges the pair of spaced-apart salicide TFR heads; and
performing a Chemical Mechanical Polishing (CMP) process to remove portions of the TFR material outside the TFR trench.

16. The method of claim 15, further comprising, after the removal process to remove portions of the TFR material outside the TFR trench, forming at least one of a phosphosilicate glass (PSG) layer or an un-doped silicate glass (USG) cap oxide layer over the structure.

17. The method of claim 15, comprising annealing the structure after depositing the TFR material to alter a temperature coefficient of resistance (TCR) of the TFR material.

18. The method of claim 17, comprising annealing the structure to achieve a TCR of the TFR material to a non-zero TCR value of less than |1100 ppm/° C.|.

19. The method of claim 17, comprising annealing the structure to achieve a TCR of the TFR material to a non-zero TCR value of less than |50 ppm/° C.|.

20. The method of claim 17, comprising annealing the structure to achieve a TCR of the TFR material to a non-zero TCR value of less than |10 ppm/° C.|.

\* \* \* \* \*